(12) United States Patent  
Rolfe

(10) Patent No.: US 6,633,024 B2
(45) Date of Patent: Oct. 14, 2003

(54) SCAN LINE TO SCAN LINE FEEDFORWARD IN AN AUTOFOCUS SYSTEM OF AN IMAGING SYSTEM

(75) Inventor: Norman F. Rolfe, Carlisle, MA (US)

(73) Assignee: Agfa Corporation, Wilmington, MA (US)

( * ) Notice: Subject to any disclaimer, the term of this patent is extended or adjusted under 35 U.S.C. 154(b) by 28 days.

(21) Appl. No.: 10/012,948

(22) Filed: Dec. 10, 2001

(65) Prior Publication Data

US 2003/0106984 A1 Jun. 12, 2003

(51) Int. Cl.[7] .................. G02B 27/40; G02B 27/64; G02B 7/04
(52) U.S. Cl. .............. 250/201.2; 250/201.5; 369/44.14
(58) Field of Search .............. 250/201.2, 201.5, 250/216, 214 R, 234–235, 201.4, 559.22, 559.29; 358/450–451, 482, 412, 512, 474, 480; 396/79, 95; 369/44.23, 44.14, 44.21, 44.32

(56) References Cited

U.S. PATENT DOCUMENTS

| 4,641,020 | A | * | 2/1987 | Iwai | 250/201.5 |
| 4,866,688 | A | * | 9/1989 | Ohtake et al. | 369/44.13 |
| 5,477,302 | A | * | 12/1995 | Ogasawara | 396/95 |
| 5,585,883 | A | * | 12/1996 | Yamano | 396/91 |
| 6,147,944 | A | * | 11/2000 | Kwon et al. | 369/44.32 |
| 6,483,091 | B1 | * | 11/2002 | Sadler et al. | 250/201.2 |

* cited by examiner

Primary Examiner—David Porta
Assistant Examiner—Patrick J. Lee
(74) Attorney, Agent, or Firm—John A. Merecki; Robert A. Sabourin; Joseph D. King

(57) ABSTRACT

The present invention provides an autofocus system for an imaging system, such as an external drum platesetter. The autofocus system automatically focuses each of a plurality of scan lines produced by an imaging system on a supply of recording material, and includes a control loop with scan line to scan line feedforward of a motor command waveform.

17 Claims, 7 Drawing Sheets

SCAN LINE TO SCAN LINE FEEDFORWARD IN AN AUTOFOCUS SYSTEM OF AN IMAGING SYSTEM

FIELD OF THE INVENTION

The present invention is in the field of imaging systems. More particularly, the present invention provides an autofocus system for an imaging system that incorporates a feedforward signal to increase the effective tracking bandwidth of the autofocus system.

BACKGROUND OF THE INVENTION

In external drum imaging systems, a movable optical carriage is used to displace an image exposing or recording source in a slow scan direction while a cylindrical drum supporting recording material on an external surface thereof is rotated with respect to the image exposing source. The drum rotation causes the recording material to advance past the exposing source along a direction that is substantially perpendicular to the slow scan direction. The recording material is therefore advanced past the exposing source by the rotating drum in a fast scan direction.

An image exposing source may include an optical system for scanning one or more exposing or recording beams. Each recording beam may be separately modulated according to a digital information signal representing data corresponding to the image to be recorded.

The recording media to be imaged by an external drum imaging system is commonly supplied in discrete sheets and may comprise a plurality of plates, hereinafter collectively referred to as "plates" or "printing plates." Each plate may comprise one or more layers supported by a support substrate, which for many printing plates is a plano-graphic aluminum sheet or a polyester substrate. Other layers may include one or more image recording (i.e., "imageable") layers such as a photosensitive, radiation sensitive, or thermally sensitive layer, or other chemically or physically alterable layers. Printing plates are available in a wide variety of sizes, typically ranging, e.g., from 9"×12", or smaller, to 58"×80", or larger.

During high-resolution imaging, each recording beam is generally tightly focused to produce a small spot having a predefined spot size at the image plane (e.g., the imageable layer of the recording media supported on an external drum). Because of the smallness of the spot at the image plane, the spot profile changes very rapidly away from this plane. This causes a rapid change in the spot size and/or energy density, potentially causing a degradation of the quality of the recorded image with slight defocussing. The spot profile can be adversely affected by a large number of factors, such as variations in the finish of the drum surface (drum runout) and media distortion (e.g., thickness variations in the media). To compensate for these factors, autofocus systems are commonly incorporated into high-resolution imaging systems.

In external drum imaging systems in which the drum is rotated at a relatively low speed, currently available autofocus systems are capable of adequately maintaining the recording beam(s) in focus. In external drum imaging systems in which the drum is rotated at a high speed, and/or when using recording media with local distortion, however, an autofocus system with a high tracking bandwidth is required. Unfortunately, mechanical resonances within the imaging system impose a limit on the tracking bandwidth and, consequently, image quality suffers.

A need therefore exists for an autofocus system that is capable of providing a high effective tracking bandwidth required by high speed external drum imaging systems.

SUMMARY OF THE INVENTION

The present invention provides an autofocus apparatus and method with improved effective tracking bandwidth that utilizes a control loop with scan line to scan line feedforward of a motor command.

Generally, the present invention provides an apparatus, comprising:

an autofocus system for automatically focusing each of a plurality of scan lines produced by an imaging system on a supply of recording material, the autofocus system including a control loop with scan line to scan line feedforward of a motor command waveform.

The present invention additionally provides an autofocus system, comprising:

a focus detector for determining a focus error of a current scan line being imaged on a supply of recording media by an imaging system, and for generating a motor command waveform corresponding to the focus error;

an adder for adding the final motor command waveform of the previous imaged scan line to the motor command waveform of the current scan line to generate a final motor command waveform for the current scan line; and a motor for controlling the imaging system to focus the current scan line on the recording media in response to the final motor command waveform of the current scan line.

The present invention also provides an autofocus method, comprising:

imaging a scan line on a supply of recording media;

determining a focus error of the scan line using positional information (e.g., final motor command information as a function of position) from a focus correction for a previously imaged scan line; and focusing the scan line on the recording media based on the focus error.

The present invention further provides an imaging system, comprising:

a supply of recording media;

a media support surface for supporting the recording media during imaging;

a scanning system for imaging a plurality of scan lines on the recording media; and an autofocus system, coupled to the scanning system, for automatically focusing each of the scan lines on the recording media, wherein the autofocus system includes a control loop with scan line to scan line feedforward of a motor command waveform.

BRIEF DESCRIPTION OF THE DRAWINGS

The features of the present invention will best be understood from a detailed description of the invention and embodiments thereof selected for the purpose of illustration and shown in the accompanying drawings in which.

DETAILED DESCRIPTION OF THE INVENTION

Figure 1:
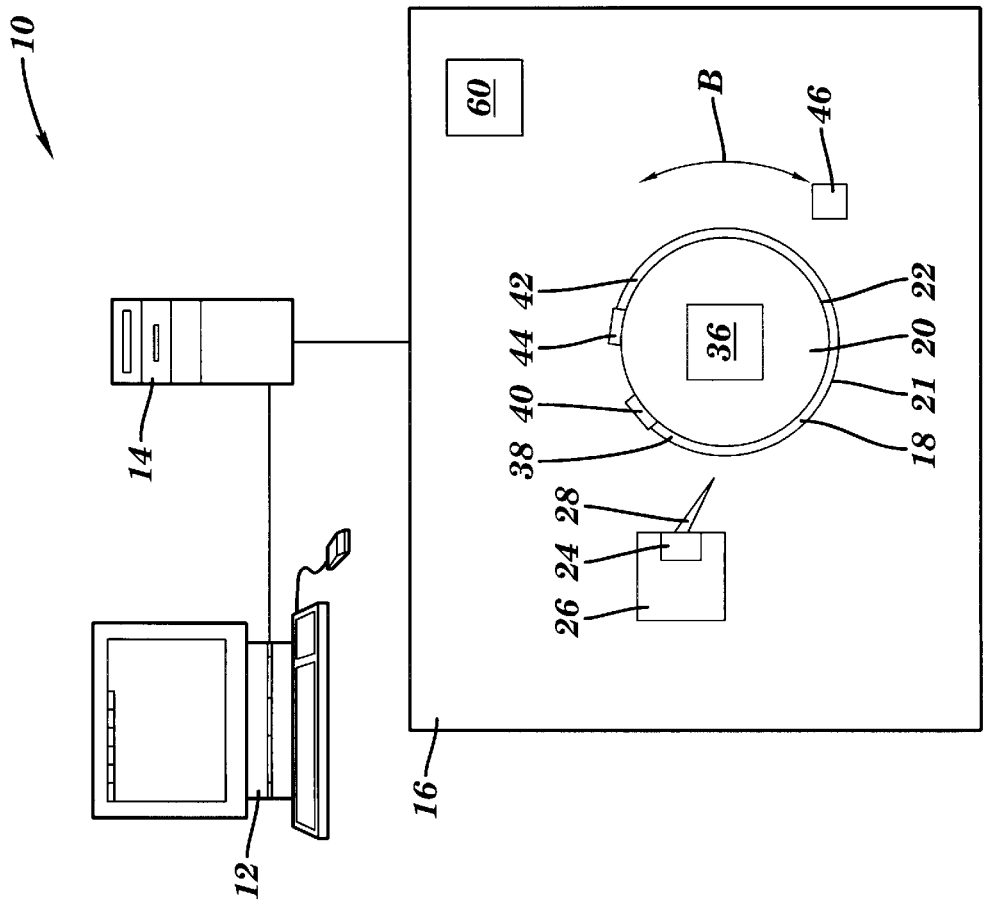
FIG. 1 illustrates an external drum imaging system for recording images onto a supply of recording media such as a printing plate.

The features of the present invention are illustrated in detail in the accompanying drawings, wherein like reference numerals refer to like elements throughout the drawings. Although the drawings are intended to illustrate the present invention, the drawings are not necessarily drawn to scale.

An example of an external drum imaging system 10 is illustrated in FIG. 1. In this example, the imaging system 10 comprises an external drum platesetter configured to record digital data onto a printing plate. Although described below with regard to an external drum platesetter, the autofocus method and apparatus of the present invention may be used in conjunction with a wide variety of other types of external drum, internal drum, or flatbed imaging systems, including imagesetters and the like, without departing from the intended scope of the present invention.

The imaging system 10 generally includes a front end computer or workstation 12 for the design, layout, editing, and/or processing of digital files representing pages to be printed, a raster image processor (RIP) 14 for further processing the digital pages to provide rasterized page data (e.g., rasterized digital files) for driving an image recorder, or engine, such as an external drum platesetter 16, for recording the rasterized digital files onto a printing plate or other type of recording media. The external drum platesetter 16 records the digital data (i.e., "job") provided by the RIP 14 onto a supply of photosensitive, radiation sensitive, thermally sensitive, or other type of suitable printing plate 18. The printing plate 18 may be manually loaded, or provided (e.g., in a cassette) and loaded onto the external drum platesetter 16 by a media supply or autoloading system 60. The media supply system 60 may accept a plurality of the same size printing plates 18, and/or may accept a plurality of different size printing plates 18.

Figure 2:
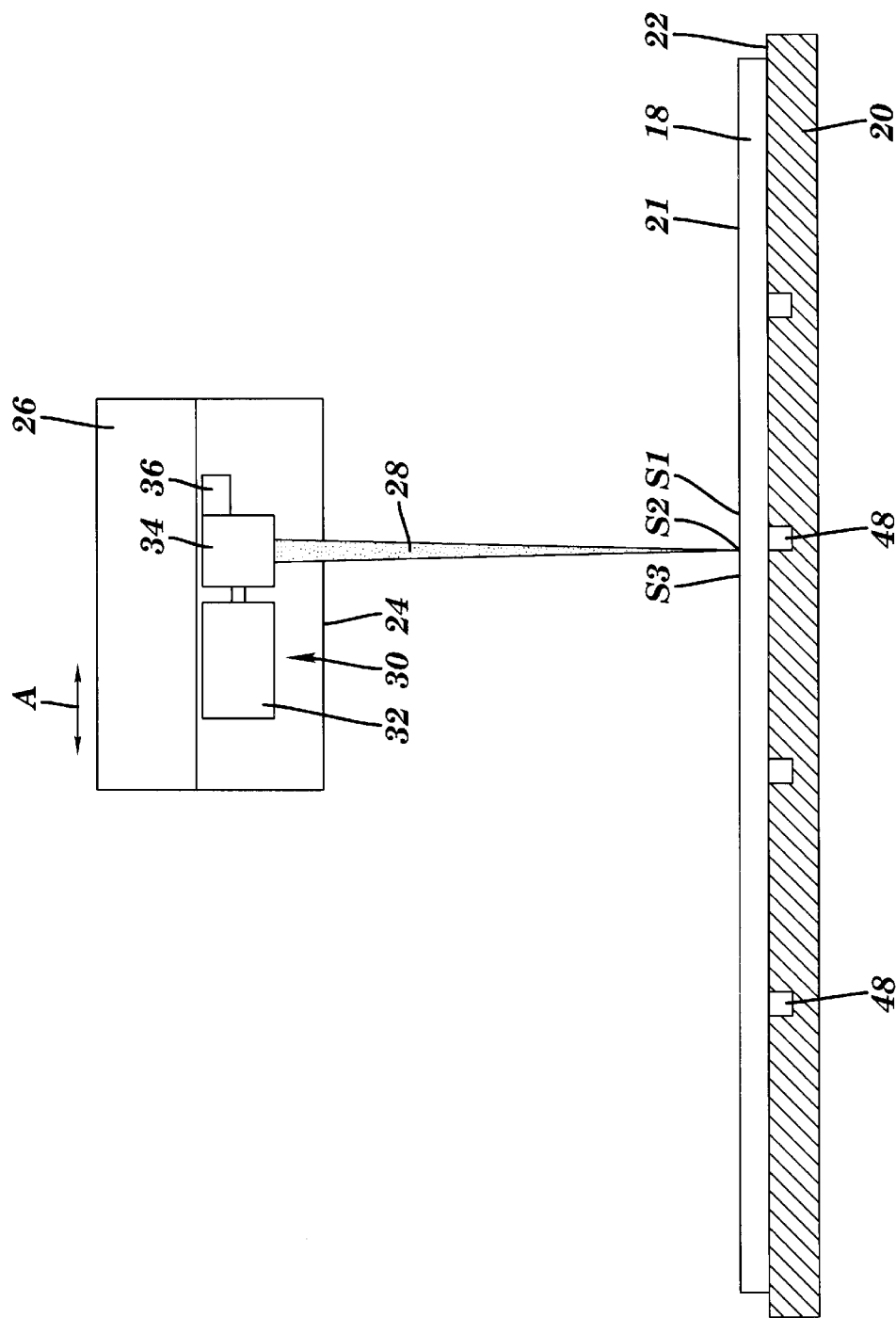
FIG. 2 illustrates an example of an imaging system including a movable optical carriage and scanning system with autofocus, usable in the external drum imaging system of FIG. 1.

The external drum platesetter 16 includes an external drum 20 having a cylindrical media support surface 22 for supporting the printing plate 18 during imaging. The external drum platesetter 16 further includes a scanning system 24, coupled to a movable carriage 26, for recording digital data onto the imaging surface 21 of the printing plate 18 using a single or multiple imaging beams 28. An example of a scanning system 24 is illustrated in FIG. 2. In particular, the scanning system 24 is displaced by the movable carriage 26 in a slow scan axial direction (directional arrow A) along the length of the rotating external drum 20 to expose the printing plate 18 in a line-wise manner when a single beam is used or in a section-wise manner for multiple beams. Three adjacent scan lines are represented in FIG. 2 as S1, S2, and S3.

The external drum 20 is rotated by a drive system 36 in a clockwise or counterclockwise direction as indicated by directional arrow B in FIG. 1. The printing plate 18 is imaged while the drum is rotated by the drive system 36.

As further illustrated in FIG. 2, the scanning system 24 includes a system 30 for generating the imaging beam or beams 28. The system 30 comprises a light or radiation source 32 for producing the imaging beam or beams 28 (illustrated for simplicity as a single beam), and an optical system 34 with autofocus system 36 for focusing the imaging beam or beams 28 onto the printing plate 18.

In the external drum imaging system 10 shown in FIG. 1, the leading edge 38 of the printing plate 18 is held in position against the media support surface 22 by a leading edge clamping mechanism 40. Similarly, the trailing edge 42 of the printing plate 18 is held in position against the media support surface 22 by a trailing edge clamping mechanism 44. Alternately, or in addition, a vacuum source 46 may be used to draw a vacuum through an arrangement of ports and vacuum grooves 48 (see, e.g., FIG. 2) formed in the media support surface 22 to hold the printing plate 18 against the media support surface 22. A registration system, comprising, for example, a set of registration pins or stops on the external drum 20, and a plate edge detection system, may be used to accurately and repeatably position and locate the printing plate 18 on the external drum 20.

Figure 3:
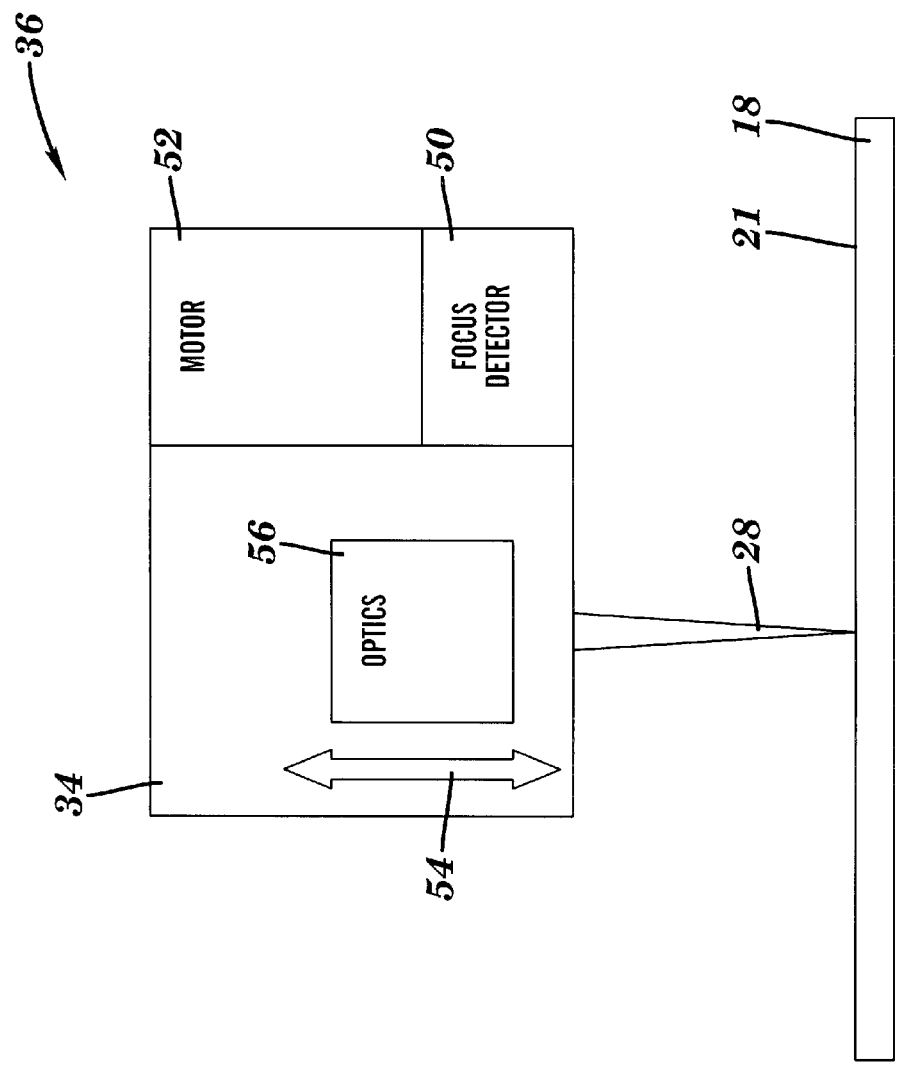
FIG. 3 illustrates the autofocus system of FIG. 2 in greater detail.

The autofocus system 36 is illustrated in greater detail in FIG. 3. The autofocus system 36 generally comprises a focus detector 50 of a type known in the art for determining whether the imaging surface 21 of the printing plate 18 is in focus, too close, or too far away from the scanning system 24. A motor 52 (e.g., a linear motor) is commonly utilized to compensate for the focus error of the imaging beam 28 determined by the focus detector 50 by displacing or otherwise adjusting one or more components of the scanning system 24 in response to a command signal (e.g., a motor current or voltage command) provided by the focus detector 50. As indicated by directional arrow 54 in FIG. 3, for example, one or more optical components of optical system 56 of the scanning system 24 may be displaced by the motor 52 in a manner known in the art to bring the imaging beam 28 back into focus at the imaging surface 21 of the printing plate 18.

Figure 4:
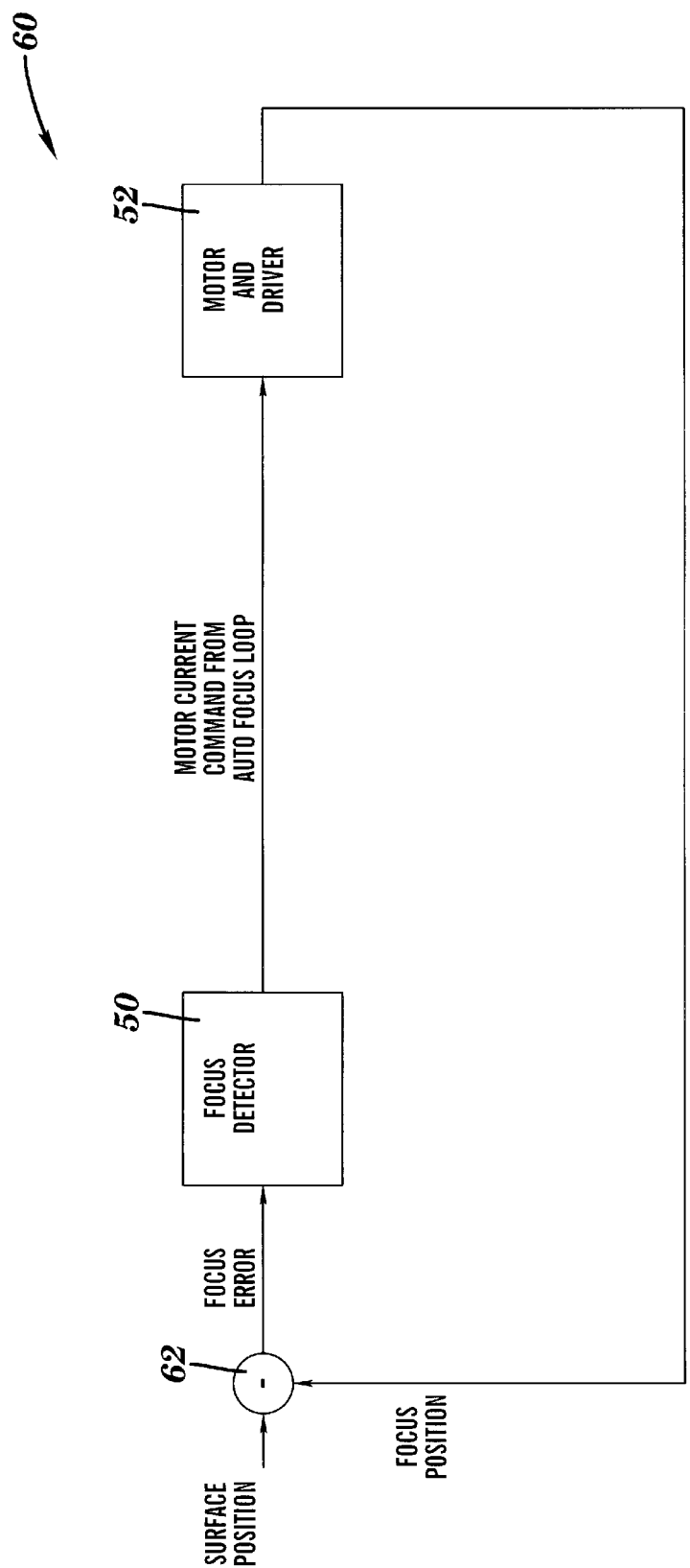
FIG. 4 illustrates an autofocus control loop of the related art.

An autofocus control loop 60 of the related art is illustrated in FIG. 4, and is described with regard to the autofocus system of FIG. 3, wherein it is assumed that the optics 56 of the scanning system 24 are displaced by the motor 52 to maintain focus. In the autofocus control loop 60, the focus detector 50 determines the amount of focus error in the imaging system by subtracting 62 the current position of the imaging surface 21 of the printing plate 18 from the current focus position of the imaging optics 56. The focus error is subsequently provided to the motor 52 by the focus detector 50 in the form of a motor current command. Upon receipt of the motor current command, the motor 52 adjusts, based on the motor current command, the position of the optics 56 relative to the imaging surface 21 of the printing plate 18, to compensate for the focus error and to bring the imaging system back into focus. This process is repeated from scan line to scan line. Unfortunately, mechanical resonances within the imaging system impose a limit on the tracking bandwidth of this type of autofocus system.

Figure 5:
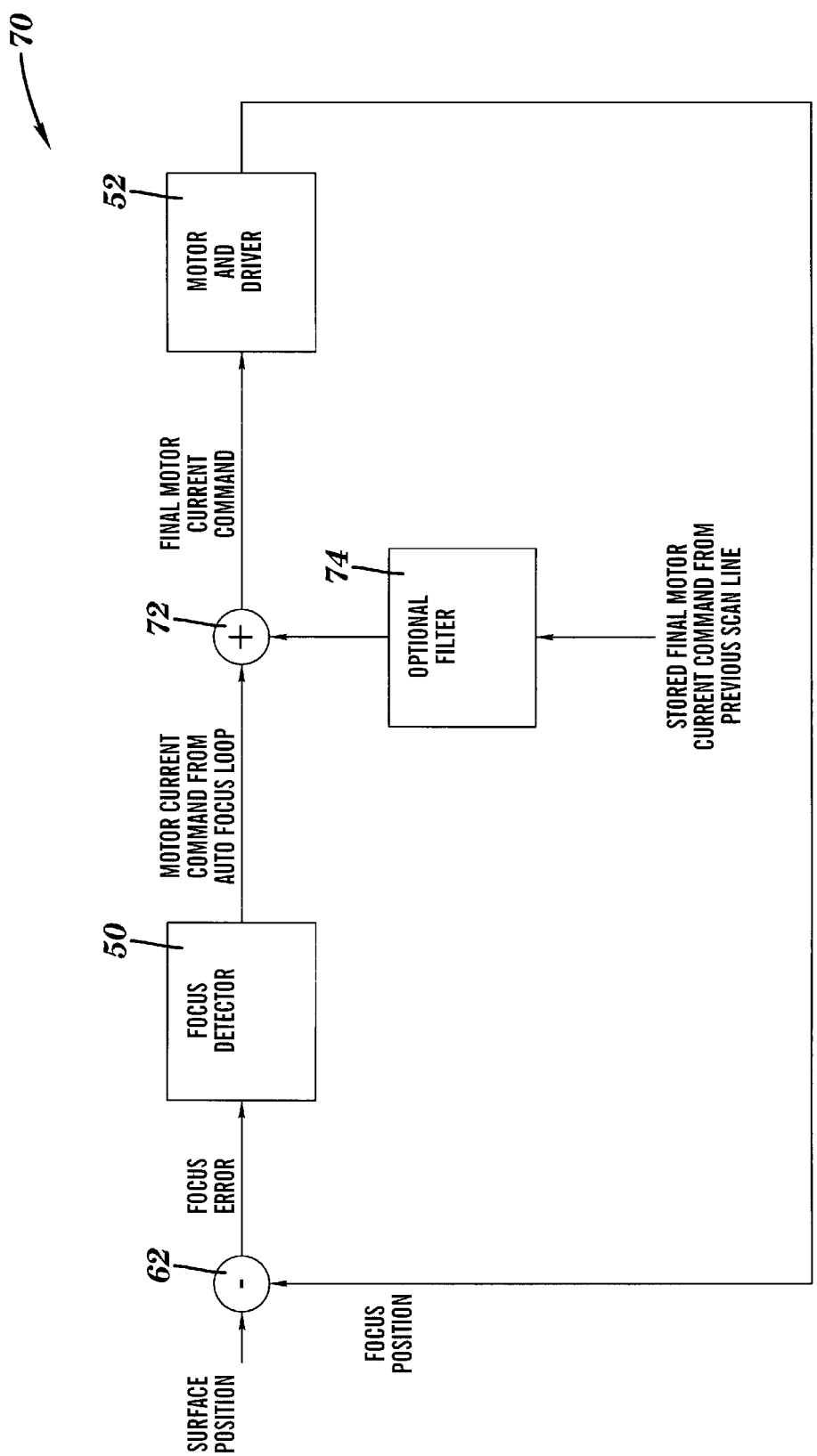
FIG. 5 illustrates an autofocus control loop with scan line to scan line feedforward in accordance with the present invention.

In order to overcome the deficiencies of the related art, and provide the high effective tracking bandwidth required by high speed external drum imaging systems, the autofocus system of the present invention utilizes an autofocus control loop with scan line to scan line feedforward. Such an autofocus control loop 70 is illustrated in FIG. 5. Again, the autofocus control loop 70 is described with regard to the autofocus system of FIG. 3, wherein it is assumed that the optics 56 of the scanning system 24 are displaced by the motor 52 to maintain focus.

In the autofocus control loop 70 of the present invention, the tracking bandwidth loss due to mechanical resonances is restored by feeding the previous scan line motor current command waveform forward into the control loop while tracking the focus of the current scan line. This is possible because the required motor current to ensure perfect focus changes little from scan line to scan line due to small media deviation along the drum axis. In this way, the autofocus control loop 70 has to correct only for the difference between the required motor current for the present scan line and the motor current from the previous scan line, as opposed to supplying the entire motor current for the present scan line. In particular, referring to FIG. 5, the stored final motor current command waveform of the previous scan line is added 72 (i.e., fed forward as a command) to the motor current command waveform of the scan line currently being tracked to produce a final motor current command waveform. The final motor current command waveform is stored using known techniques for use with the next scan line to be tracked, and the current focus position of the imaging optics 56, as set by the final motor current command waveform, is fed back and subtracted 62 from the current position of the imaging surface 21 of the printing plate. Since the motor current commands from one scan line to the next are substantially identical to each other, the tracking error of the autofocus control loop 70 is significantly reduced.

A mathematical analysis of the autofocus control loop 70 of FIG. 5 is detailed below with reference to FIGS. 6 and 7. As will become evident from the following discussion, the stored final motor current command waveform of the previous scan line may have to be filtered by optional filter 74 prior to being added 72 to the motor current command waveform of the scan line currently being tracked.

Figure 6:
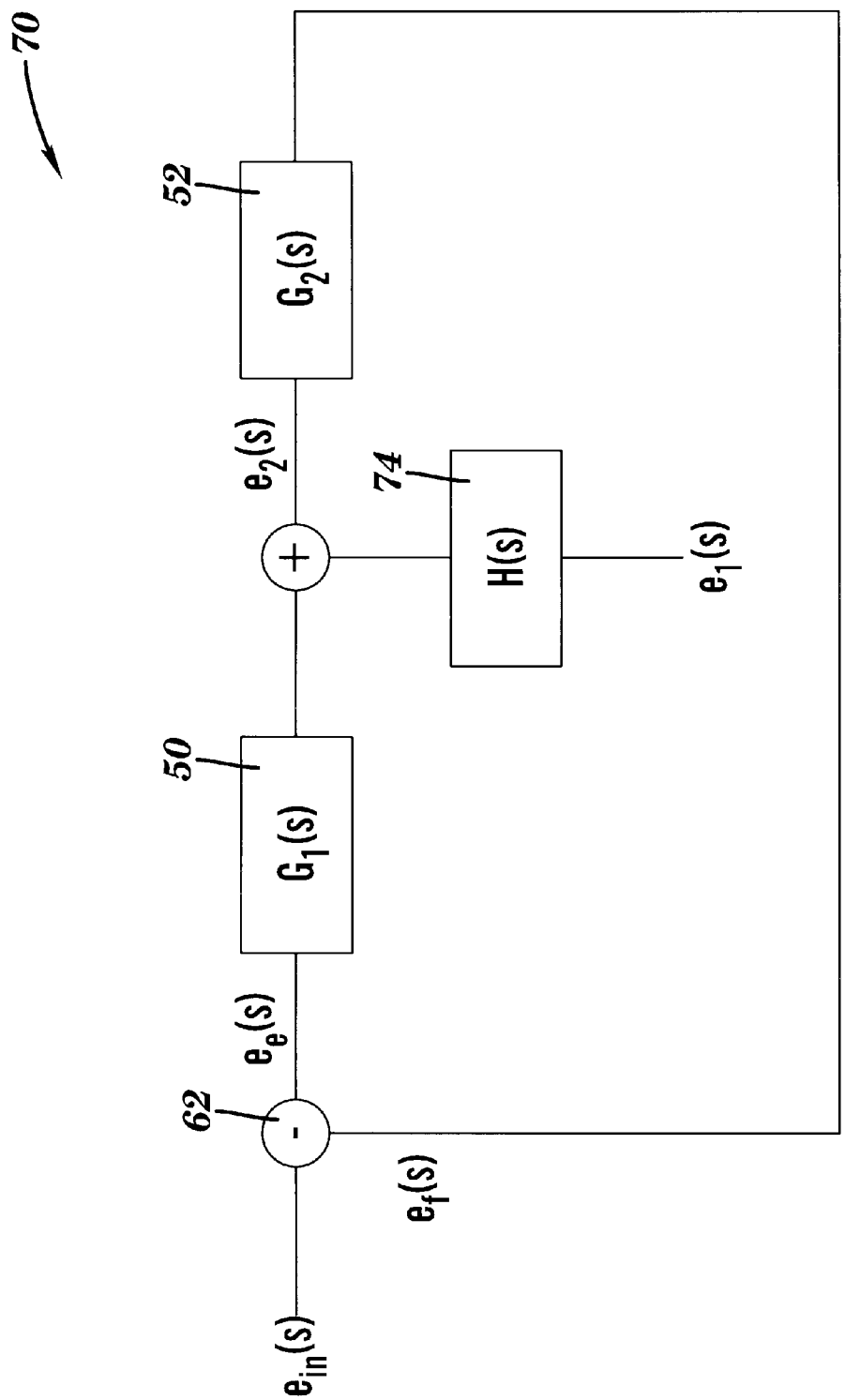
FIG. 6 is a mathematical representation of the autofocus control loop of FIG. 5.

In FIG. 6, the variables represent the following (see FIG. 5):

$e_{in}$=Surface Position
$e_f$=Focus Position
$e_e$=Focus Error
$e_1$=Stored Final Motor Current Command Waveform of the previous scan line
$e_2$=Final Motor Current Command Waveform of the present scan line
$G_1$=Transfer Function of Focus Detector 50
$G_2$=Transfer Function of Motor 52
$H$=Transfer Function of Filter 74

Therefore, in the autofocus control loop 70 of FIG. 6:

$$e_e = e_{in} - e_f$$

$$e_e = e_{in} - [e_e G_1 + e_1 H] G_2$$

$$e_e[1 + G_1 G_2] = e_{in} - H G_2 e_1$$

$$e_e = \frac{1}{1 + G_1 G_2}(e_{in} - H G_2 e_1)$$

where $G_1 G_2$ is the open loop gain of the control loop.

For the first scan line we have:

$e_1 = 0$:

and:

$$e_e = \frac{1}{1 + G_1 G_2} e_{in}$$

$$e_2 = G_1 e_e + H e_1 = \frac{G_1}{1 + G_1 G_2} e_{in}$$

Thus, the error is reduced by approximately the first power of the loop gain for frequencies below the unity open loop gain frequency.

For the second scan line we have:

$$e_1 = k e_2 = k \frac{G_1}{1 + G_1 G_2} e_{in}$$

where k accounts for component tolerances and:

$$e_e = \frac{1}{1 + G_1 G_2} e_{in}\left(1 - \frac{k H G_1 G_2}{1 + G_1 G_2}\right) = \frac{1 + (1 - kH) G_1 G_2}{(1 + G_1 G_2)^2} e_{in}$$

$$e_2 = G_1 e_e + H e_1 = \frac{G_1}{1 + G_1 G_2} e_{in}\left[\frac{1 + (1 - kH) G_1 G_2}{1 + G_1 G_2} + kH\right] =$$

$$\frac{G_1}{1 + G_1 G_2} e_{in}\left(\frac{1 + kH + G_1 G_2}{1 + G_1 G_2}\right) = G_1 \left[\frac{1 + kH + G_1 G_2}{(1 + G_1 G_2)^2}\right] e_{in}$$

for $k = 0$ or $H = 0$: $e_e = \frac{1}{1 + G_1 G_2} e_{in}$ for $k = 1$ and $H = 1$: $e_e = \frac{1}{(1 + G_1 G_2)^2} e_{in}$ Thus, the error is reduced by approximately the square of the loop gain for frequencies below the unity open loop gain frequency.

For the third scan line we have:

$$e_1 = k e_2 = k G_1 \left[\frac{1 + kH + G_1 G_2}{(1 + G_1 G_2)^2}\right] e_{in}$$

and:

$$e_e = \frac{1}{1 + G_1 G_2} e_{in}\left[1 - \frac{k H G_1 G_2 (1 + kH + G_1 G_2)}{(1 + G_1 G_2)^2}\right] =$$

$$\frac{1}{1 + G_1 G_2} \frac{1 + 2 G_1 G_2 + (G_1 G_2)^2 - kH(1 + kH) G_1 G_2 - kH(G_1 G_2)^2}{(1 + G_1 G_2)^2} e_{in} =$$

$$\frac{1 + (2 - kH - k^2 H^2) G_1 G_2 + (1 - kH)(G_1 G_2)^2}{(1 + G_1 G_2)^3} e_{in}$$

for $k = 0$ or $H = 0$: $e_e = \frac{1}{1 + G_1 G_2} e_{in}$ for $k = 1$ and $H = 1$: $e_e = \frac{1}{(1 + G_1 G_2)^3} e_{in}$ For k=1 and H=1, the error is reduced by approximately the cube of the loop gain for frequencies below the unity open loop gain frequency.

Similarly it can be shown for the $n^{th}$ scan line and for k=1 and H=1, that the focus error is equal to:

$$\frac{1}{(1 + G_1 G_2)^n} e_{in}.$$

Figure 7:
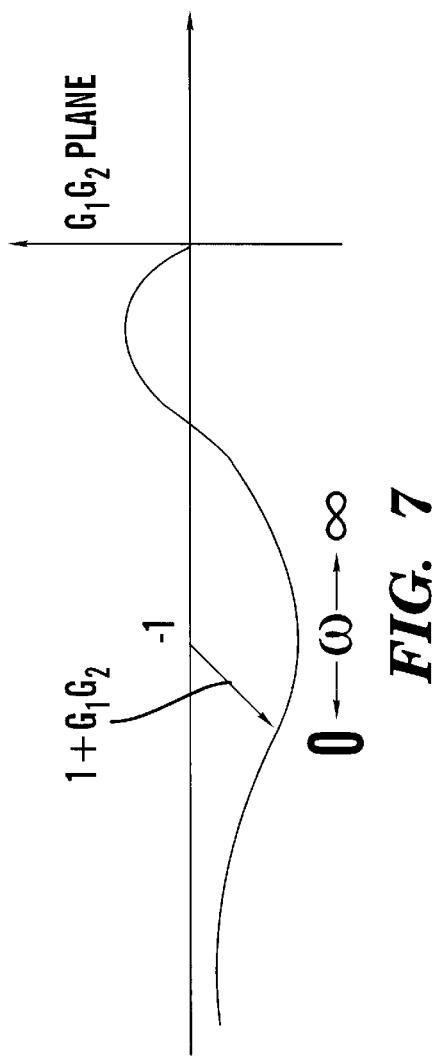
FIG. 7 is a polar plot related to the mathematical representation of FIG. 6.

For k=1 and H=1, at frequencies in the vicinity of the unity open loop gain frequency, $|1 + G_1 G_2|$ may be less than one as shown in the polar plot of $1 + G_1 G_2$ illustrated in FIG. 7, and therefore $e_e$ will increase from scan line to scan line without limit. Therefore, at these frequencies, H must be made sufficiently close to zero. H should take the form of a notch filter, centered in the vicinity of the open loop unity gain frequency. In order to prevent the same at frequencies beyond the unity open loop gain frequency, H should take the form of a notch filter in tandem with a low pass filter. Alternatively, $G_1G_2$ could be modified such that $|1+G_1G_2|$ is larger than one over the entire frequency range of 0 to infinity.

The increase in the focus error reduction using an autofocus loop with scan line to scan line feedforward as compared to using an autofocus loop without scan line to scan line feedforward is equal to:

$$\frac{\frac{1}{1+G_1G_2}e_{in}}{\frac{1}{(1+G_1G_2)^n}e_{in}} = (1+G_1G_2)^{n-1}$$

Figure 8:
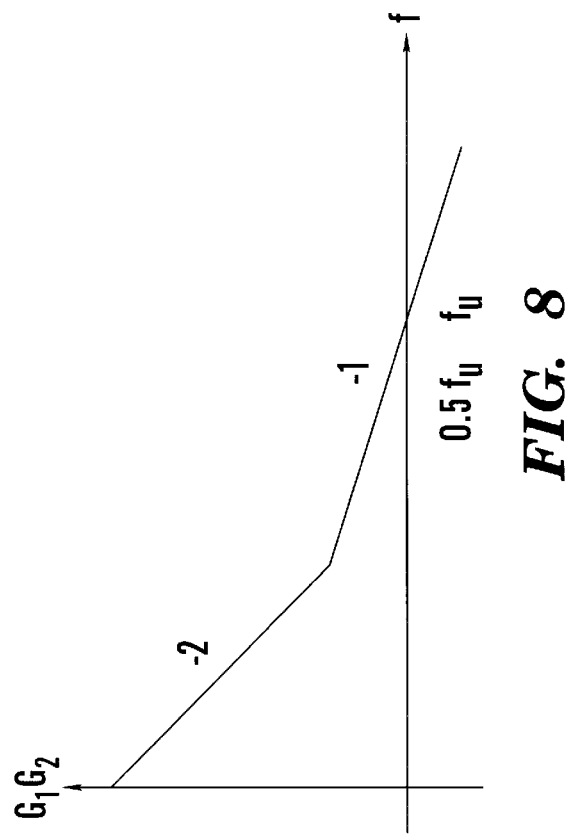
FIG. 8 is a typical plot of the magnitude of $G_1G_2$ with frequency.

The following is an example of the numerical improvement in focus error reduction with scan line to scan line feedforward:

Using a typical plot of the magnitude of $G_1G_2$ with frequency, as shown in FIG. 8, for frequency components of ½ $f_u$, where $f_u$ is the unity open loop gain frequency of the auto focus loop (also commonly known as the system bandwidth), the focus error reduction improvement for the $4^{th}$ scan line is equal to:

$$(1+G_1G_2)^{n-1} \approx (1+2)^{4-1} = 27$$

which is significant. Without scan line to scan line feedforward the reduction in focus error for frequency components at ½ $f_u$ is approximately equal to 2. With scan line to scan line feedforward this number increases to 54.

The foregoing description of the present invention has been presented for purposes of illustration and description. It is not intended to be exhaustive or to limit the invention to the precise form disclosed, and many modifications and variations are possible in light of the above teaching. For example, the final motor command waveform of the previous scan line could be added to the motor command waveform of the present scan line displaced in time relative to the once per revolution index of the drum. Such modifications and variations that may be apparent to a person skilled in the art are intended to be included within the scope of this invention.

I claim:

1. An apparatus, comprising:
   an autofocus system for automatically focusing each of a plurality of scan lines produced by an imaging system on a supply of recording material, the autofocus system including:
      a control loop with scan line to scan line feedforward of a motor command waveform, wherein the autofocus system adds a final motor command waveform of a previous scan line to a motor command waveform of a current scan line to produce a final motor command waveform for the current scan line; and
      a motor for controlling the imaging system to focus each of the plurality of scan lines on the recording material, wherein the motor focuses the current scan line on the recording media in response to the final motor command waveform of the current scan line;
      wherein the autofocus system determines a focus error of the current scan line by subtracting a focus position of the imaging system, as set by the motor in response to the final motor command waveform of the previous scan line, from a surface position of the recording media for the current scan line.

2. The apparatus of claim 1, further including a filter for filtering the final motor command waveform of the previous scan line prior to feeding the final motor command waveform of the previous scan line forward into the control loop.

3. The apparatus of claim 2, wherein the filter is selected from the group consisting of a notch filter and a notch filter in tandem with a low pass filter.

4. The apparatus of claim 1, wherein the imaging system includes a rotatable external drum for supporting the recording media during imaging.

5. An autofocus system, comprising:
   a focus detector for determining a focus error of a current scan line being imaged on a supply of recording media by an imaging system, and for generating a motor command waveform corresponding to the focus error;
   an adder for adding a final motor command waveform of a previously imaged scan line to the motor command waveform of the current scan line to generate a final motor command waveform for the current scan line; and
   a motor for controlling the imaging system to focus the current scan line on the recording media in response to the final motor command waveform of the current scan line;
   wherein the focus error of the current scan line is determined by the focus detector by subtracting positional information of the imaging system, as set by the final motor command waveform of the previously imaged scan line, from a surface position of the recording media for the current scan line.

6. The autofocus system of claim 5, further including a filter for filtering the final motor command waveform of the previously imaged scan line prior to adding the final motor command waveform of the previously imaged scan line to the motor command waveform of the current scan line.

7. An autofocus method, comprising:
   imaging a current scan line on a supply of recording media using an imaging system;
   determining a focus error of the current scan line by subtracting positional information of the imaging system, as set by a final motor command waveform of a previously imaged scan line, from a surface position of the recording media for the current scan line; and
   focusing the current scan line on the recording media based on the focus error by:
      generating a motor command waveform corresponding to the focus error;
      adding the final motor command waveform of the previously imaged scan line to the motor command waveform of the current scan line to generate a final motor command waveform for the current scan line; and
      controlling the imaging system to focus the current scan line on the recording media in response to the final motor command waveform of the current scan line.

8. The autofocus method of claim 7, further including, prior to the adding step, filtering the final motor command waveform of the previously imaged scan line.

9. An imaging system, comprising:
   a supply of recording media;
   a media support surface for supporting the recording media during imaging;

a scanning system for imaging a plurality of scan lines on the recording media; and an autofocus system, coupled to the scanning system, for automatically focusing each of the scan lines on the recording media, wherein the autofocus system includes a control loop with scan line to scan line feedforward of a motor command waveform, the autofocus system including:

a focus detector for determining a focus error of a current scan line being imaged on the recording media by the scanning system, and for generating a motor command waveform corresponding to the focus error, wherein the focus error of the current scan line is determined by subtracting positional information of the scanning system, as set by a final motor command waveform of a previously imaged scan line, from a surface position of the recording media for the current scan line;

an adder for adding the final motor command waveform of the previously imaged scan line to the motor command waveform of the current scan line to generate a final motor command waveform for the current scan line; and a motor for controlling the scanning system to focus the current scan line on the recording media in response to the final motor command waveform of the current scan line.

10. The imaging system of claim 9, wherein the media support surface comprises a rotatable external drum.

11. An apparatus, comprising:

an autofocus system for automatically focusing each of a plurality of scan lines produced by an imaging system on a supply of recording material, the autofocus system including:

a control loop with scan line to scan line feedforward of a motor command waveform, wherein the autofocus system is configured to feed a final motor command waveform of a previous scan line forward into the control loop while tracking the focus of a current scan line; and a filter for filtering the final motor command waveform of the previous scan line prior to feeding the final motor command waveform of the previous scan line forward into the control loop.

12. The apparatus of claim 11, wherein the filter is selected from the group consisting of a notch filter and a notch filter in tandem with a low pass filter.

13. An autofocus system, comprising:

a focus detector for determining a focus error of a current scan line being imaged on a supply of recording media by an imaging system, and for generating a motor command waveform corresponding to the focus error;

an adder for adding a final motor command waveform of a previously imaged scan line to the motor command waveform of the current scan line to generate a final motor command waveform for the current scan line;

a motor for controlling the imaging system to focus the current scan line on the recording media in response to the final motor command waveform of the current scan line; and a filter for filtering the final motor command waveform of the previously imaged scan line prior to adding the final motor command waveform of the previously imaged scan line to the motor command waveform of the current scan line.

14. The autofocus system of claim 13, wherein the filter is selected from the group consisting of a notch filter and a notch filter in tandem with a low pass filter.

15. An autofocus method, comprising:

imaging a scan line on a supply of recording media;

determining a focus error of the scan line using positional information from a focus correction for a previously imaged scan line; and focusing the scan line on the recording media based on the focus error, wherein focusing the scan line comprises:

generating a motor command waveform corresponding to the focus error;

filtering the final motor command waveform of the previously imaged scan line;

adding a final motor command waveform of the previously imaged scan line to the motor command waveform of the current scan line to generate a final motor command waveform for the current scan line; and controlling the imaging to focus the current scan line on the recording media in response to the final motor command waveform of the current scan line.

16. The autofocus method of claim 15, wherein filtering the final motor command further comprises:

filtering the final motor command using a filter selected from the group consisting of a notch filter and a notch filter in tandem with a low pass filter.

17. The imaging system of claim 9, further including a filter for filtering the final motor command waveform of the previously imaged scan line prior to adding the final motor command waveform of the previously imaged scan line to the motor command waveform of the current scan line.

* * * * *